United States Patent [19]

Oowaki

[11] Patent Number: 4,825,268
[45] Date of Patent: Apr. 25, 1989

[54] SEMICONDUCTOR MEMORY DEVICE

[75] Inventor: Yukihito Oowaki, Yokohama, Japan

[73] Assignee: Kabushiki Kaisha Toshiba, Kawasaki, Japan

[21] Appl. No.: 213,435

[22] Filed: Jun. 27, 1988

Related U.S. Application Data

[63] Continuation of Ser. No. 845,555, Mar. 28, 1986, abandoned.

[30] Foreign Application Priority Data

Mar. 29, 1985 [JP] Japan ............................ 60-63463

[51] Int. Cl.$^4$ .................... H01L 29/78; H01L 27/02; H01L 27/10; H01L 27/02
[52] U.S. Cl. .................................. 357/23.6; 357/41; 357/45; 357/51; 357/88
[58] Field of Search .................. 357/23.6, 41, 45, 51, 357/88

[56] References Cited

U.S. PATENT DOCUMENTS 4,355,374 10/1982 Sakai et al. ........................... 357/90

FOREIGN PATENT DOCUMENTS 0197713 10/1986 European Pat. Off. ........... 357/23.6
58-175860 10/1983 Japan .................................. 357/23.6

OTHER PUBLICATIONS

Yamada et al., "A Submicron VLSI Memory with a 4b-at-a-Time Built-in ECC Circuit", ISSCC 84, Feb. 22, 1984, pp. 104–105.
Micron Technology, Inc., Technical Data Sheet on 256K DRAM.

Primary Examiner—J. Carroll
Attorney, Agent, or Firm—Finnegan, Henderson, Farabow, Garrett & Dunner

[57] ABSTRACT

A semiconductor memory device comprises a plurality of one-bit memory cells each having a MOS transistor and a MOS capacitor and arranged two-dimensionally. Of the memory cells along the column direction selected according to selection of a word line, adjacent cells are made different in the structure of cell capacitors. Such structural difference is realized by presence or absence of an impurity layer which has the same electrically-conductive type as a semiconductor substrate and higher in impurity concentration than the substrate between their storage nodes and the substrate, or by the difference in the surface area of the storage nodes when viewed from the substrate side, whereby when the semiconductor memory device is subjected to a single α ray at most one of the memory cells at least along the column direction causes a soft error.

11 Claims, 10 Drawing Sheets

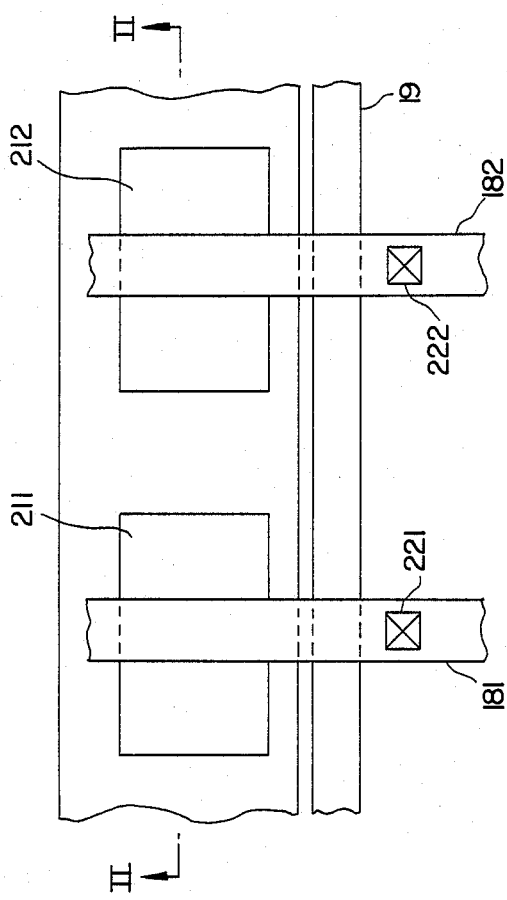
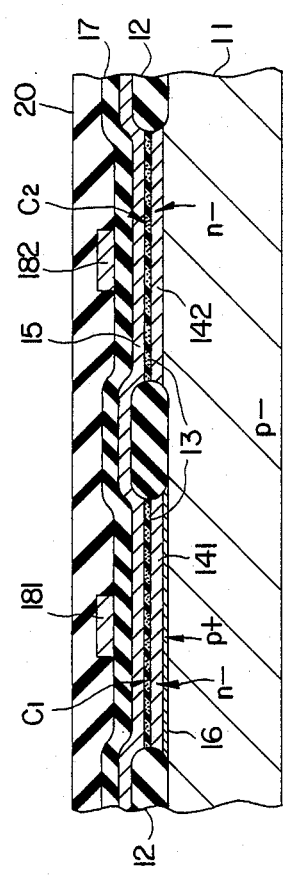
FIG. 1
FIG. 2 a # SEMICONDUCTOR MEMORY DEVICE

BACKGROUND OF THE INVENTION

1. Field of the Invention

The present invention relates to semiconductor memory devices which comprise a plurality of memory cells each having a MOS transistor and a MOS capacitor, and more specifically, to a semiconductor memory device which is free from a soft error problem.

2. Description of the Prior Art

A dynamic RAM (hereinafter referred to as RAM), which comprises memory cells each having one transistor and one capacitor, has been widely used and the recent tendency of the D-RAM is its higher degree in integration and miniaturization. For the purpose of miniaturization of the D-RAM, it is essential that the memory cell has reduced capacitance in the cell capacitor. However, with the reduced capacitance of the cell capacitor, when subjected to α ray irradiated from its package or the like, the D-RAM generates minority carriers in a semiconductor substrate and flow of such minority carriers into a storage node of the cell capacitor causes a troublesome soft error.

As a method of reducing the soft error to a practically negligible extent, it has been proposed to provide an error detecting and correcting circuit (ECC circuit) on a D-RAM chip and this method is now at its trial and test stage.

Reliable detection and correction of an error can be made by increasing the redundancy of information bits to be stored, which increase in the number of redundant bits and resulting complication of the ECC circuit inevitably require an increase in the chip area, thus hindering improvement of integration of the D-RAM.

At the current stage of integration and miniaturization, when subjected to irradiation of a single α ray, a cell array will generate a single soft error for one column according to selection of one word line. However, when the integration degree increases and adjacent cells become closer, it is expected that a plurality of cells in one column of the cell array generate soft errors in response to incidence o the single α ray. Simultaneous removal of such a plurality of soft errors requires a larger ECC circuit and more redundant bits than the case where a single soft error occurs, which increases chip area, cost and number of logical elements necessary for the ECC circuit, thus increasing access time.

SUMMARY OF THE INVENTION

In view of the above circumstances, it is an object of the present invention to provide a semiconductor memory device which can prevent increase in the number of redundant bits and enlargement of an ECC circuit, can resolve the soft error problem resulting from incidence of α ray, and can realize the enhancement of reliability and integration of a D-RAM.

That is, the present invention is based on such an idea that the array is arranged to generate at most a single soft error at each column of cells, whereby correction of errors can be made by a small-scale ECC circuit.

It is well known that under the condition that each column selected according to selection of one word line generates a single soft error, the redundant bits can be greatly decreased in number and the ECC circuit can be made small in size. According to the present invention, memory cells adjacent at least along the column direction are made mutually different in the amount of minority carriers injected from a semiconductor substrate or well region on which the cell arrays are fabricated into their storage nodes or made different in their capacitance so as to be likely to generate soft error in only one of the memory cells in one column.

That is, the present invention provides a semiconductor memory device which comprises a plurality of one-bit memory cells arranged two-dimensionally each having a MOS transistor and a MOS capacitor, characterized in that the MOS capacitor in each of the memory cells comprises two types of cell capacitors which are alternately arranged in at least one direction, whereby at most one of the memory cells arranged along one direction of the cell array generates one soft error in response to incidence of a single α ray. As a result, the ECC circuit can be made small in size and the number of redundant bits for error detection and correction can be made small to a large extent, while the D-RAM can be made high in reliability and integration.

BRIEF DESCRIPTION OF THE DRAWINGS

In the accompanying drawings:

FIG. 1 is a fragmental plan view showing a structure of a memory cell in a semiconductor memory device in accordance with an embodiment of the present invention;

FIG. 2 is a cross-sectional view of the major part of the embodiment of FIG. 1;

DESCRIPTION OF THE PREFERRED EMBODIMENTS

Figure 3:
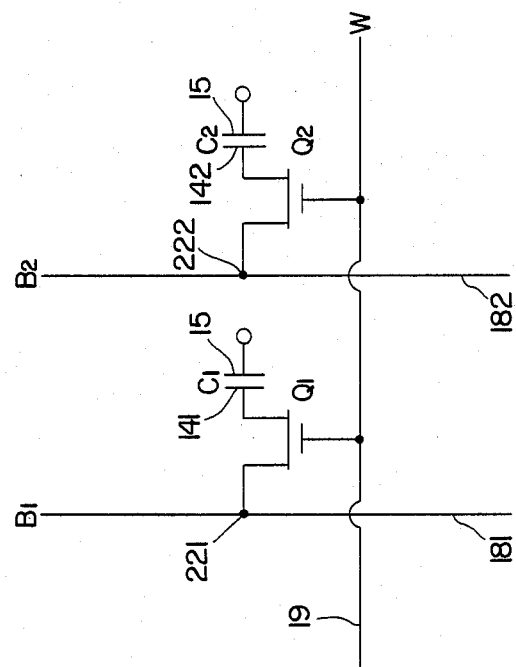
FIG. 3 is an equivalent circuit of the memory cell shown in FIGS. 1 and 2.

The present invention will be detailed with reference to illustrated embodiments.

Referring first to FIGS. 1 and 2, there is shown a schematic structure, in part, of a memory cell device in accordance with an embodiment of the present invention in which FIG. 1 is a plan view, in part, of the memory cell device and FIG. 2 is a cross-sectional view taken along line II—II in FIG. 1. In the drawings, reference numeral 11 is a P−Si substrate, 12 an oxide film for element separation, 13 a first gate oxide film, 141 and 142 N− regions, 15 a first poly-Si film, 16 a P+ region, 17 an inter-layer insulating film, 181 and 182Al bit lines, 19 a second poly Si film (word line), 20 an inter-layer insulating films, 211 and 212 cell capacitor regions, and 221 and 222 contact holes, respectively. The gate oxide film 13 surrounded by the N− region 141 and the first poly-Si film 15 forms a first cell capacitor $C_1$, while the film 13 surrounded by the N region 142 and the first poly-Si film 15 forms a second capacitor $C_2$. Provided between the Si substrate 11 and the N− region 141 of the cell capacitor region 211 constituting the first capacitor $C_1$ is the P+ region 16 which is formed by a well known ion implantation, an epitaxial or other techniques.

The above-mentioned arrangement refers only to a part (one column) of a plurality of memory cells arranged in rows and columns. Actually, a plurality of such memory cells having the first and second capacitors $C_1$ and $C_2$ are alternately arranged in rows and columns. An equivalent circuit of the structure of FIGS. 1 and 2, as shown in FIG. 3, comprises one-bit memory cells each having a MOS transistor and a MOS capacitor.

Figure 4:
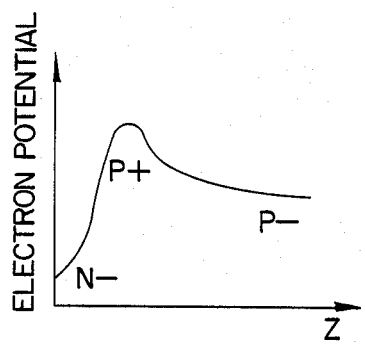
FIG. 4 is a graph showing a potential distribution of a cell capacitor region illustrated on the left side of FIGS. 1 and 2 with respect to the vertical direction of the substrate.
Figure 5:
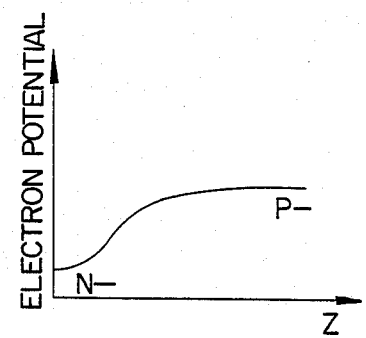
FIG. 5 is a graph showing a potential distribution of a cell capacitor region illustrated on the right side of FIGS. 1 and 2 with respect to the substrate vertical direction.

With such an arrangement as mentioned above, since the P+ region 16 is provided only in the first cell capacitor region 211 between the N− region 141 and P−Si substrate 11, the first cell capacitor $C_1$ has fewer minority carriers injected in its storage node than those injected in the second cell capacitor $C_2$. The reason is as follows:

FIGS. 4 and 5 show relations between the electronic potential of the storage node and the vertical direction of the substrate with respect to the first and second cell capacitors $C_1$ and $C_2$. In the first cell capacitor C, as shown in FIG. 4, the P+ region 16, which forms a potential barrier, prevents injection of minority carriers (in this case, electrons) generated by α ray irradiation into the storage node. In the second cell capacitor $C_2$, on the other hand, since such a potential barrier as mentioned above is not present, minority carriers existing therearound are collected into its storage node by a so called funneling effect. Therefore, minority carriers generated in the Si substrate 11 by a single α ray particle are selectively injected in neighboring second cell capacitor $C_2$. As a result, it will be prevented that the adjacent two memory cells both generate soft errors.

In this manner, in accordance with the present embodiment, two types of cell capacitor structures are used, that is, the P+ region 16 is provided between one cell capacitor electrode (N− region 14) and the Si substrate 11 to form a potential barrier, so that only a single memory cell generates a soft error in a column by α ray irradiation. This enables miniaturization of an ECC circuit and remarkable reduction of the number of redundant bits for error detection and correction. As a result, the present embodiment can sufficiently cope with the future high integration demand of the D-RAM.

Figure 7A:
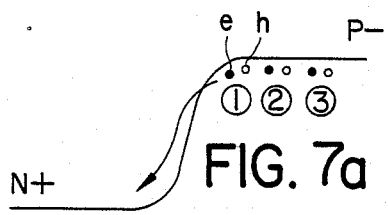
FIG. 7 (a), (b) and (c) are schematic diagrams for explaining the transition of electron potential under influence of the funneling effect of the cell capacitor region shown on the right side of FIGS. 1 and 2, respectively.
Figure 7B:
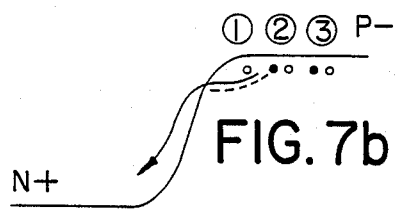
Figure 7C:
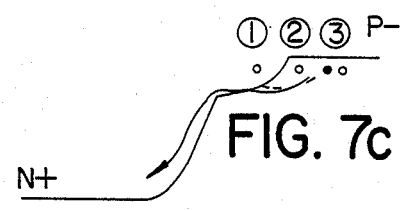
Figure 6:
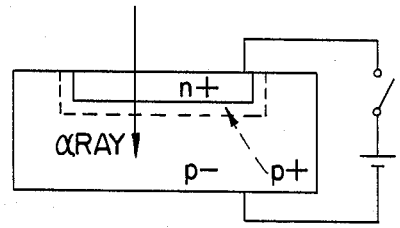
FIG. 6 is a schematic sectional view for explaining a funneling effect.

The above-mentioned funneling effect refers to the following phenomenon. Assume now that such a cell capacitor as mentioned above is subjected to a α ray as shown in FIG. 6. This causes a high concentration of e (electron)-h (hole) pairs to generate along the propagation of the α ray in the P− substrate The second cell capacitor structure has such an electron potential as shown in FIG. 7 (a). An electron of an e-h pair ① generated by the incidence of the α ray is drifted with time under influence of an electric field to the N+ region at a relatively high speed as shown in FIG. 7 (b), while the relatively slow hole in the pair remains and establishes around an electric field, which acts to reduce the electron potential. This causes an electron in an e-h pair ② drift to the N+ region at a relatively high speed under influence of this electric field as shown in FIG. 7 (c). In this manner, the potential groove is expanded and almost all minority carriers e in the vicinity of the cell are injected into the cell.

Figure 8:
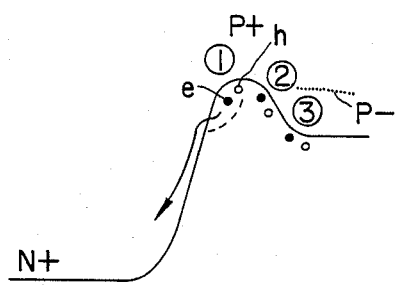
FIG. 8 is a schematic diagram for explaining the transition of electron potential under influence of the funneling effect of the cell capacitor region shown on the left side of FIGS. 1 and 2.

On the other hand, the first cell capacitor structure has such a potential hump (P+ potential barrier) as shown in FIG. 8 and the potential hump acts to prevent formation of the groove at the initial stage. For this reason, the first cell capacitor structure has less injection efficiency (of minority carriers) than the second cell capacitor structure.

Figure 9:
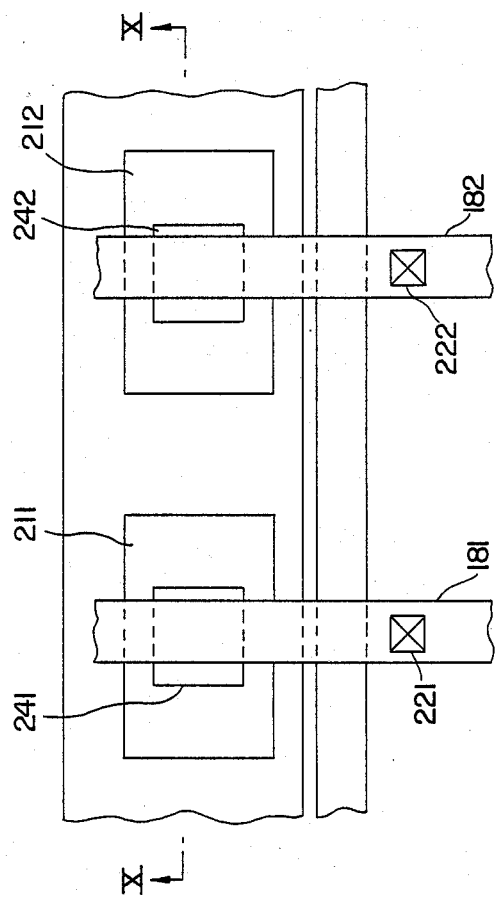
FIG. 9 is a plan view showing a structure of a memory cell in a semiconductor memory device in accordance with another embodiment of the present invention.
Figure 10:
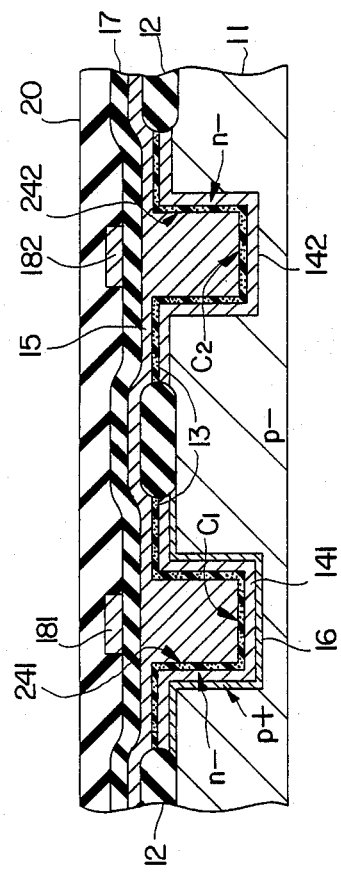
FIG. 10 is a cross-sectional view of the major part of the embodiment of FIG. 9.

There is shown another embodiment of the present invention in FIGS. 9 and 10, in which FIG. 9 is a plan view of the embodiment and FIG. 10 is a cross-sectional view taken along line X—X. The present embodiment is different from the first embodiment in that grooves 241 and 242 are provided in the capacitor formation region to trench capacitors. In the present embodiment, a P+ region 16 is provided to form a potential barrier on the side of a first capacitor region 211 providing a first cell capacitor $C_1$, as in the first embodiment.

It goes without saying that such a structure provides substantially the same effect as in the previous embodiment.

Figure 11:
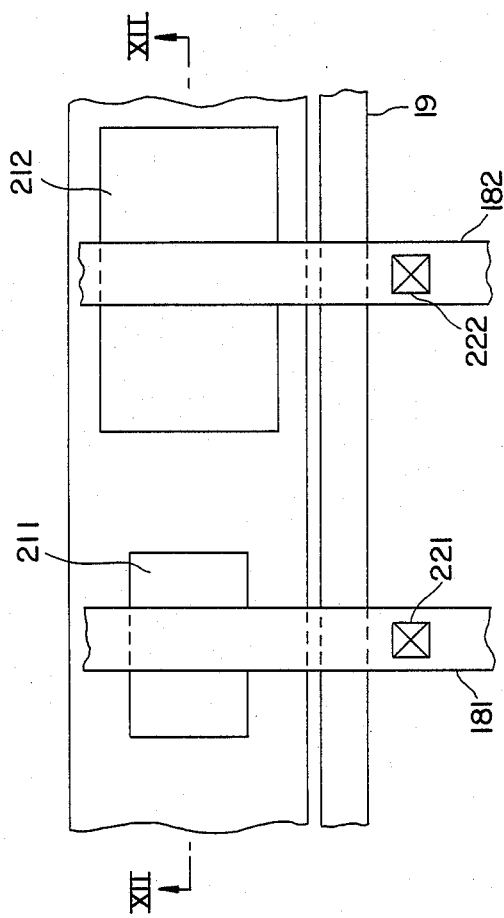
FIG. 11 is a plan view showing a structure of a memory cell in a semiconductor memory device in accordance with yet another embodiment of the present invention.
Figure 12:
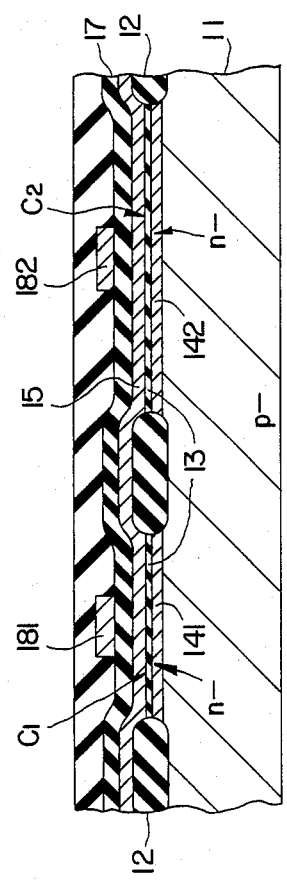
FIG. 12 is a cross-sectional view of the major part of the embodiment of FIG. 11.

FIGS. 11 and 12 show yet another embodiment of the present invention, with a plan view of the embodiment in FIG. 11 and a cross-sectional view taken along line XII—XII in FIG. 12. In the present embodiment, instead of providing the P+ region for said potential barrier formation in either one of the first and second cell capacitors $C_1$ and $C_2$ adjacent along the column direction, first and second cell capacitor regions 211 and 212 providing first and second cell capacitors $C_1$ and $C_2$ are positively made different in area from each other as illustrated, so long as predetermined capacitances can be reliably provided respectively to the first and second cell capacitor regions 211 and 212 on the one hand and this will not prevent miniaturization of the cell device as a highly integrated semiconductor device on the other hand. Therefore, even when such a cell array is subjected to such single α ray irradiation as mentioned above at the following different positions, the present embodiment can provide a good result. That is, (1) when the array is subjected to the α ray at the first cell capacitor region 211 or in the vicinity thereof, minority carriers generated in the semiconductor substrate 11 are first drifted into the first cell capacitor region 211 causing a soft error (more precisely, with a higher probability). However, this prevents the minority carriers from drifting to other cells and thus this ensures that other cells can reliably avoid such a soft error.

(2) When the array is subjected to the o ray at a zone between the first and second cell capacitor regions 211 and 212, minority carriers generated in the semiconductor 11 are dispersedly drifted into the first and second cell capacitor regions 211 and 212. However, the second cell capacitor $C_2$ has relatively high capacitive allowance and thus a soft error will not occur at the same time in the two cells. In this case, if a soft error occurs, it will be generated always on the side of the first cell capacitor $C_1$. Such generation of a soft error in the cell having the first capacitor Cl ensures that all other cells can reliably avoid the error, as in the case of (1).

(3) When the array is subjected to the α ray at the second cell capacitor region 212 or in the vicinity thereof, minority carriers generated in the semiconductor substrate 11 are moved into the second cell capacitor region 212. However, the second cell capacitor $C_2$ has capacitive allowance, making it difficult to generate a soft error. Of course, since all other cells can avoid inflow of the minority carriers thereinto, the other cells can reliably avoid the soft error. In this case, therefore, all the cells can reliably avoid the soft error. Due to the fact that the first and second cell capacitor regions 211 and 212 are made relatively different in area, the o ray incidence of (3) is highest in probability.

In this manner, it will be appreciated that in accordance with the present embodiment, the condition earlier mentioned, that is, "at most one memory cell generates a soft error in a column of word lines" can be satisfied.

Figure 19:
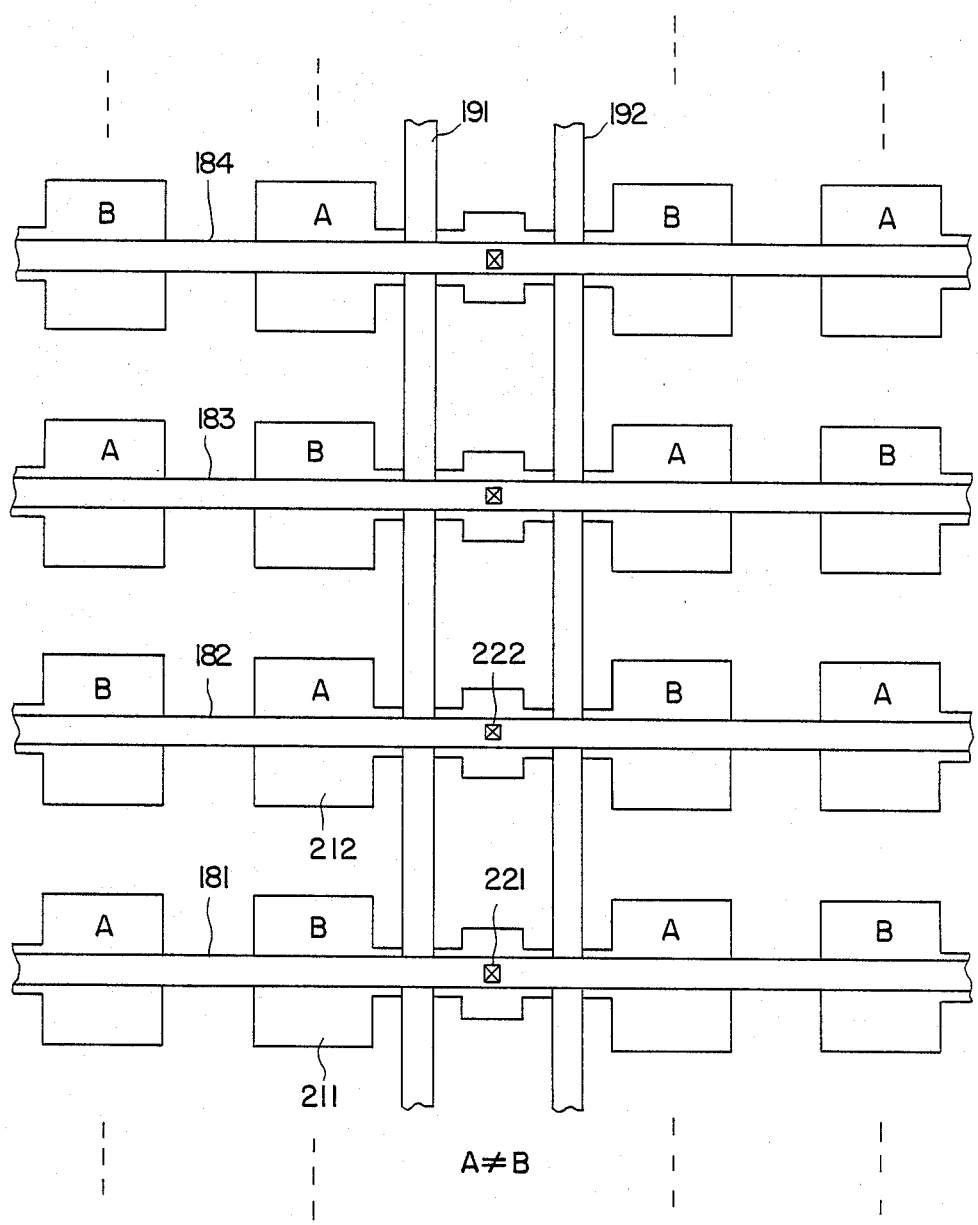
FIG. 19 is a plan view of a structure showing a number of memory cells arranged in rows and columns in a semiconductor memory device in accordance with another embodiment of the present invention.
Figure 20:
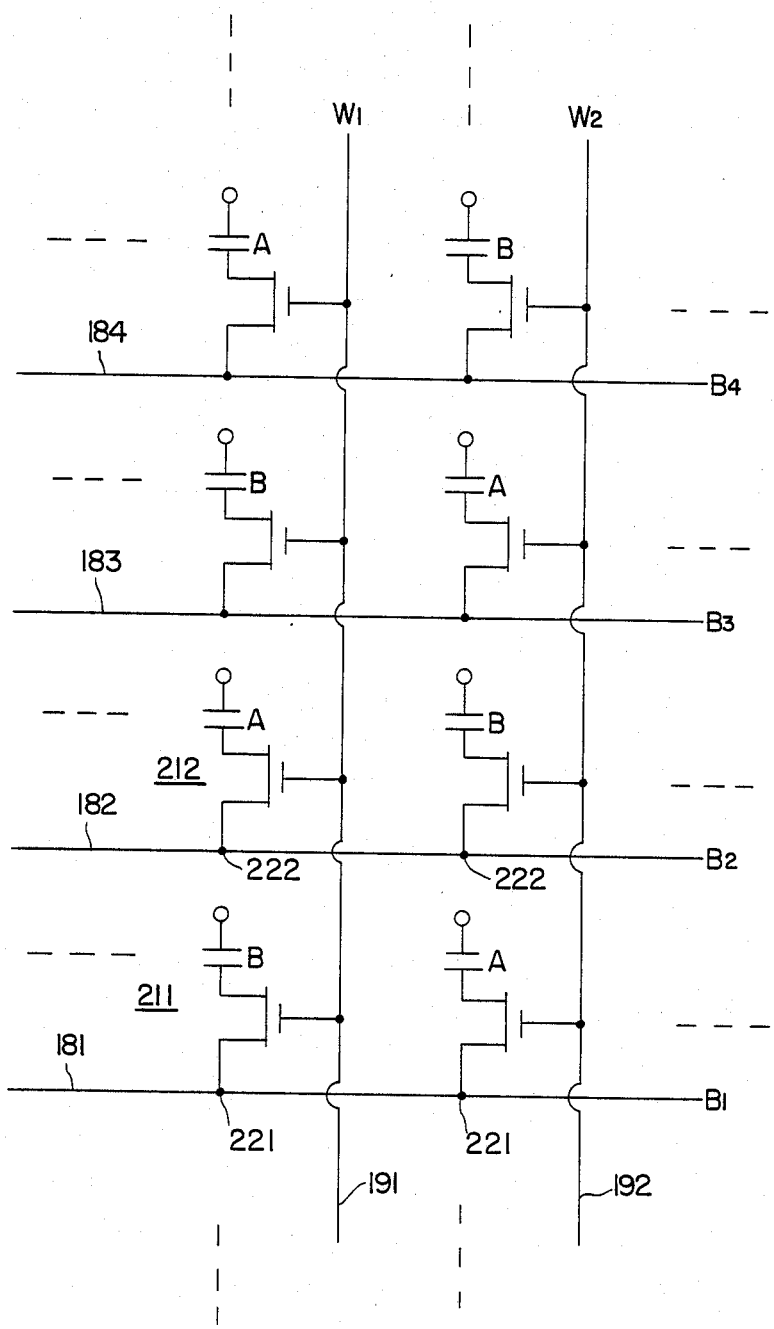
FIG. 20 is an equivalent circuit of the memory cells shown in FIG. 19.

The present invention is not limited to the above particular embodiments. For example, the first and second cell capacitors may be effectively arranged not only alternately in the column direction but also alternately as shown in the embodiment of FIGS. 19 and 20 in the row direction. Further, the difference in the structure between the first and second cell capacitors with respect to the embodiment of FIGS. 1 and 2 and the embodiment of FIGS. 9 and 10 is not limited to the presence or absence of an impurity layer having the same electrically-conductive type as the substrate and higher in impurity concentration that the substrate, but any structural difference may be allowed so long as the first and second cell capacitors are different from each other in the rate of minority carriers of the substrate injected into their storage nodes, that is, in injection efficiency.

For example, it may be so constructed that a cell capacitor of one type has a first impurity layer provided between its storage node and the semiconductor substrate, which first impurity layer is the same electrically-conductive type as the substrate and higher in impurity concentration than the substrate, while a cell capacitor of the other type has a second impurity layer provided between the storage anode and the semiconductor substrate, which second impurity layer is the same electrically-conductive type as the first impurity layer and different in impurity concentration from the first impurity layer.

Further, the embodiment of FIGS. 1 and 2 and the embodiment of FIGS. 9 and 10 are not limited to the case in which the cell capacitors are fabricated on the semiconductor substrate. Alternately, the cell capacitors can be fabricated in the impurity well region whose electrically conductive type is the same as that of the substrate or different from the substrate.

Figure 13:
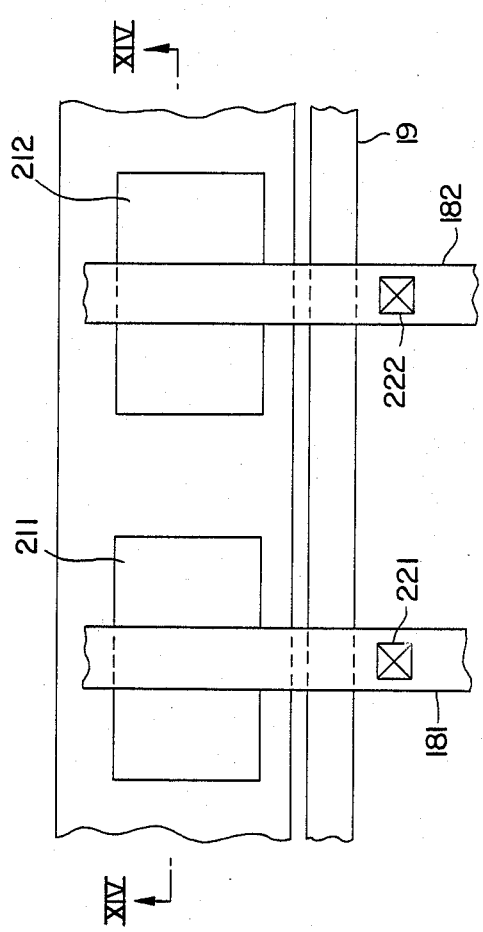
FIG. 13 is a plan view showing a structure of a memory cell in a semiconductor memory device in accordance with another embodiment of the present invention.
Figure 14:
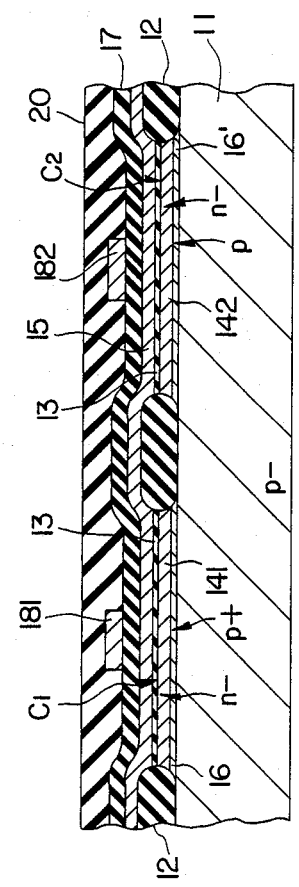
FIG. 14 is a cross-sectional view of a major part of the embodiment of FIG. 13.
Figure 15:
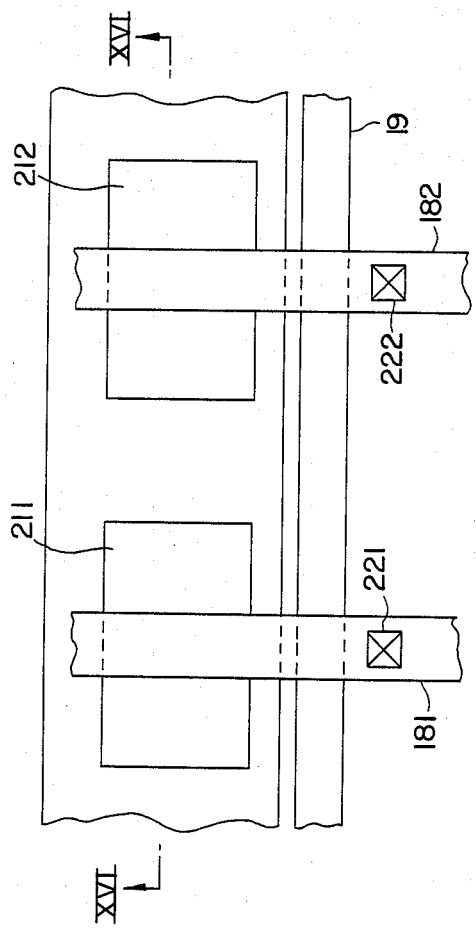
FIG. 15 is a plan view showing a structure of a memory cell in a semiconductor device in accordance with another embodiment of the present invention.
Figure 16:
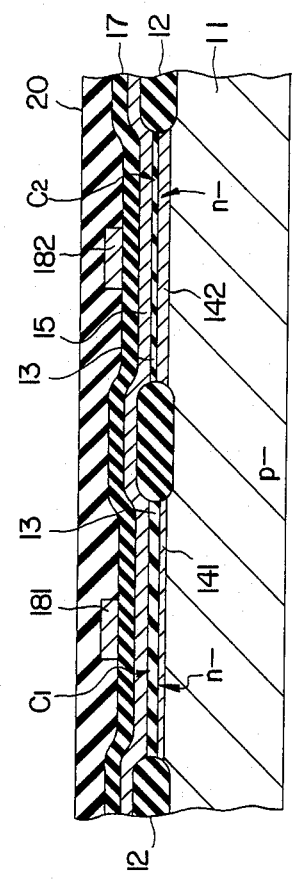
FIG. 16 is a cross-sectional view of the major part of the embodiment of FIG. 15.
Figure 17:
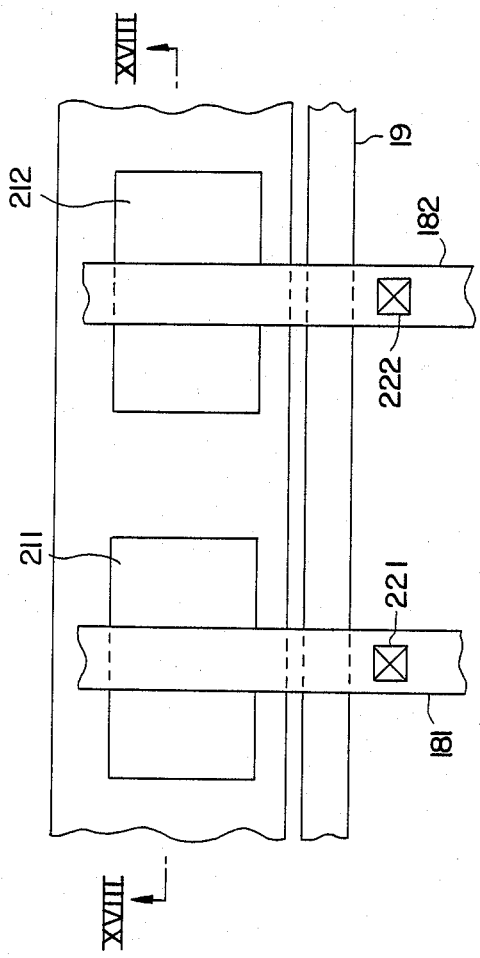
FIG. 17 is a plan view showing a structure of a memory cell in a semiconductor device in accordance with another embodiment of the present invention.
Figure 18:
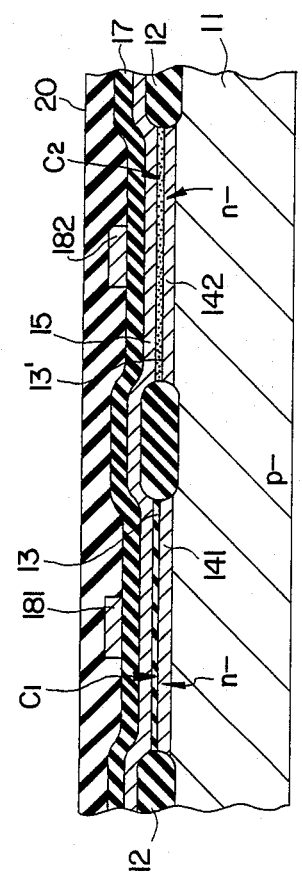
FIG. 18 is a cross-sectional view of the major part of the embodiment of FIG. 17.

Furthermore, the difference in the structure between the first and second capacitors with respect to the embodiment of FIGS. 11 and 12 is not restricted to the area difference between these cell capacitor regions, but any structural difference may be allowed so long as any structural difference as shown in the embodiment of FIGS. 15 and 16, for example, the thickness difference or material difference (that is, conductivity difference) shown in the embodiment of FIGS. 13 and 14 of the electrically conductive layer or wherein the two types of cell capacitors are different from each other in the dielectric constant of the first gate oxide film 13 of their storage nodes as shown in the embodiment of FIGS. 17 and 18, provides substantially different capacitances to the respective first and second capacitor structures. Of course, this may be realized by using two different structures of such a planar capacitor as shown in FIGS. 1 and 2 and such a trench capacitor as shown in FIGS. 9 and 10.

While the present invention has been explained with reference to the preferred embodiments shown in the drawings, it should be understood that the invention is not limited to those particular embodiments but covers all other possible modifications, alterations and equivalent arrangements included in the scope of the appended claims.

What is claimed is:

1. A semiconductor memory device comprising: a semiconductor substrate;
   a plurality of word lines arranged in columns;
   a plurality of bit lines arranged in rows; and
   a plurality of one-bit memory cells of two different types arranged two-dimensionally along the columns of word lines and the rows of bit lines, in which a first t type of memory cell includes an MOS transistor and a first type of MOS capacitor not present in a second type of memory cell, and in which the second type of memory cell includes the MOS transistor and a second type of MOS capacitor not present in the first type of memory cell and different from the first type of MOS capacitor;
   wherein the plurality of memory cells is arranged with the two different types of cell capacitors arranged alternately along the columns of word lines to reduce the probability of generation of multiple soft errors along each word line in adjacent memory cells.

2. A semiconductor memory device as set forth in claim 1, wherein said two different types of cell capacitors arranged alternately are different from each other in the rate at which minority carriers of a semiconductor substrate are injected into their storage nodes.

3. A semiconductor memory device as set forth in claim 2, wherein one of said two different types of cell capacitors has an impurity layer provided between its storage node and said semiconductor substrate, said impurity layer being the same electrically-conductive type as the substrate and higher in impurity concentration than the substrate while the other cell capacitor has not such impurity layer.

4. A semiconductor memory device as set forth in claim 1, wherein said two different types of cell capacitors arranged alternately are different from each other in capacitance.

5. A semiconductor memory device as set forth in claim 4, wherein said two types of cell capacitors are different from each other in the surface area when viewed from a substrate side of their storage nodes.

6. A semiconductor memory device as set forth in claim 2, wherein one of said two different types of cell capacitors has an impurity layer provided between its storage node and said semiconductor substrate, said impurity layer not being identical in impurity concentration to the impurity concentration of the substrate and of the storage node, to form a potential barrier between the storage node and substrate of said one of the two types of cell capacitors.

7. A semiconductor memory device as set forth in claim 4, wherein said two types of cell capacitors each include as components a first gate oxide film and an underlying impurity region, and said two types of cell capacitors are different from each other in the physical dimensions of any of said components of the cell capacitors.

8. A semiconductor memory device as set forth in claim 2, wherein said first type of cell capacitor has a first impurity layer provided between its storage node and said semiconductor substrate, said first impurity layer being the same electrically-conductive type as the substrate and higher in impurity concentration than the substrate, while the second type of cell capacitor has a second impurity layer provided between its storage node and said semiconductor substrate, said second impurity layer being the same electrically-conductive type as said first impurity layer and different in impurity concentration from said first impurity layer.

9. A semiconductor memory device as set forth in claim 5, wherein said two types of cell capacitors are different from each other in the thickness of their storage node parts.

10. A semiconductor memory device as set forth in claim 4, wherein said two types of cell capacitors each include as a component a first gate oxide film, and said two types of cell capacitors are different from each other in the dielectric constant of said first gate oxide film.

11. A semiconductor memory device as set forth in claim 1, wherein the plurality of memory cells is arranged with the two different types of cell capacitors also arranged alternately along the rows of bit lines to reduce the probability of generation of multiple soft errors along each bit line in adjacent memory cells.

* * * * *